(12) United States Patent
Fang et al.

(10) Patent No.: US 6,469,399 B2
(45) Date of Patent: Oct. 22, 2002

(54) SEMICONDUCTOR PACKAGE

(75) Inventors: Jen-Kuang Fang, Pingtung Hsien; Chun-Chi Lee, Kaohsiung, both of (TW)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 09/873,211

(22) Filed: Jun. 5, 2001

(65) Prior Publication Data

US 2001/0023984 A1 Sep. 27, 2001

Related U.S. Application Data

(63) Continuation-in-part of application No. 09/252,250, filed on Feb. 8, 1999, now abandoned.

(51) Int. Cl.$^7$ .............................................. H01L 23/544
(52) U.S. Cl. ...................... 257/797; 257/666; 257/668; 257/672; 257/676; 257/787
(58) Field of Search ................................. 257/666, 668, 257/672, 676, 787

(56) References Cited

U.S. PATENT DOCUMENTS

| | | | | |
|---|---|---|---|---|
| 5,313,102 A | | 5/1994 | Lim et al. .................... | 257/787 |
| 5,637,916 A | * | 6/1997 | Joshi ........................... | 257/668 |
| 5,898,212 A | * | 4/1999 | Kim ............................. | 257/666 |
| 6,036,173 A | | 3/2000 | Neu et al. .................... | 251/668 |

\* cited by examiner

*Primary Examiner*—David Nelms
*Assistant Examiner*—Mai-Huong Tran

(57) ABSTRACT

A semiconductor package includes a substrate panel, a chip, an upper package encapsulant, and a lower package encapsulant. The chip is mounted to the substrate panel and below a hole in the substrate panel. A number of wires interconnect the leads on the chip with the leads on the substrate panel. The upper package encapsulant is formed on the upper side of the substrate panel by filling molten liquid plastic material into an upper mold placed on the upper side of the substrate panel. The lower package encapsulant is formed on the underside of the substrate panel by filling molten liquid plastic material into a lower mold placed on the underside of the substrate panel.

10 Claims, 2 Drawing Sheets

SEMICONDUCTOR PACKAGE

This is a continuation in part of U.S. patent application Ser. No. 09/252,250 filed on Feb. 8, 1999, now abandoned.

FIELD OF THE INVENTION

The present invention relates to a semiconductor package, and more particularly to a package encapsulant formed by means of filling molten liquid plastic material simultaneously into upper and lower molds to thereby packaging an electric element or chip on a substrate panel.

DESCRIPTION OF THE RELATED ART

As ICs (integrated circuits) include a larger number of circuits, use larger silicon areas, and operate at increasingly higher clock frequencies, surface-mounted packages for ICs are correspondingly required to have increasingly higher lead counts, smaller footprints and higher electrical and thermal performance, while at the same time achieving at least existing accepted reliability standards. Conventional lead frame based packages can deliver satisfactory thermal and electrical performance up to about 300 leads.

U.S. Pat. No. 5,313,102A discloses a typical lead frame based package in which a semiconductor circuit (chip) is positioned on a mount support pad lying on a lead frame. Wirebonds are connected near the outer edges of the semiconductor chip, bonding the chip to lead fingers of the lead frame. An encapsulating material surrounds the chip, parts of the lead fingers of the lead frame, wirebonds, so that the IC package device can be surface mounted to a printed circuit board (PCB). The resulting package has a size significantly larger than that of the semiconductor chip.

For semiconductor packages having the lead count above 300 leads, other technologies, such as BGA (ball grid array), are developed. BGA is a leadless package on which the connectors to the board have been placed in an array on the bottom of the package. They are attached to the board with tiny balls of solder placed on each contact. Available in plastic and ceramic varieties, BGA is noted for its compact size, high lead count and low inductance, which allows lower voltages to be used. BGA chips are easier to align to the printed circuit board, because the balls are farther apart than leaded packages. Since the balls are underneath the chip, BGA has led the way to chip scale packaging (CSP) where the package is not more than 1.2 times the size of the semiconductor die itself.

A conventional chip package which is suitable for use in BGA applications is illustrated in FIG. 1. In the conventional chip package, a die pad 12 is provided below a hole 11 in the substrate panel 10 for mounting a chip 20 to the substrate panel 10. The substrate panel 10 is usually a flat board which extends continuously substantially throughout its entire area without interruption except for the hole 11 in a central region of the substrate panel 10. Typically, the substrate panel 10 is a PCB with a plurality of leads (not shown) formed thereon or therein. The leads of the substrate panel 10 are connected with corresponding bonding pads (not shown) formed on the chip 20 by wires 21.

Molten liquid plastic material is filled into a mold (not shown) and becomes a package encapsulant 22 after it has been hardened so as to package an underside of the chip 20 and the die pad 12 which are exposed on the underside of the substrate panel 10. The mold is removed after the encapsulant 22 has been hardened. Wires 21 on the upper side of the chip 20 cannot be packaged by the mold at the same time as the substrate panel 10 forms an obstacle. It is noted that this problem does not occur in a lead frame based semiconductor package since the molten liquid plastic material can pass, between the lead fingers, from the underside to the upper side of the lead frame.

A solution to package the wires 21 that extends beyond the hole 11 to the upper side of the substrate panel 10 is to drop molten liquid plastic material onto the substrate panel 10 in the area surrounding the wires 21 to form a package encapsulant 23. The encapsulant 23 covers an upper side of the chip 20 that is exposed on the upper side of the substrate panel 10, thereby providing a completely air tight seal for the chip 20. It is, however, found that the package encapsulant 23 has an irregular shape and a rugged surface, and the wires 21 are exposed, as the spread of the molten liquid plastic material dropped on the substrate panel 10 cannot be controlled. In addition, the dropping of the molten liquid plastic material must be proceeded in a vacuum environment to avoid generation of air bubbles in the encapsulant 23 which may cause so-called vapor explosion.

SUMMARY OF THE INVENTION

It is a primary object of the present invention to provide a semiconductor package, in which the package encapsulant is formed on both the upper side and the underside of the chip by using molds to control the amount of material needed for forming the package encapsulant, and to avoid exposure of the wires and generation of air bubbles.

In accordance with the present invention, a substrate panel with a central hole is provided, and a die pad is mounted to the underside of the substrate panel around the hole. A chip is then mounted to a underside of the die pad, and a plurality of wires interconnect leads on the chip with leads on the upper side of the substrate panel. An upper mold is placed on the upper side of the substrate panel above the hole, and a lower mold is placed on the underside of the substrate panel below the hole. Each of the upper mold and the lower mold includes a mold gate through which molten liquid plastic material is poured into the molds so as to form an upper package encapsulant and a lower package encapsulant on the upper side and the lower side of the substrate panel, respectively, thereby providing a completely air tight environment for the chip.

Since the molten liquid plastic material is poured onto the upper and lower sides of the substrate panel by using molds, the problems of irregular shape of the package encapsulant, rugged surface of the package encapsulant, exposure of wires, and generation of air bubbles in the package encapsulant in the conventional technique can all be prevented.

Other objects, advantages, and novel features of the invention will become more apparent from the following detailed description when taken in conjunction with the accompanying drawings.

DETAILED DESCRIPTION OF THE PREFERRED EMBODIMENTS

Figure 1:
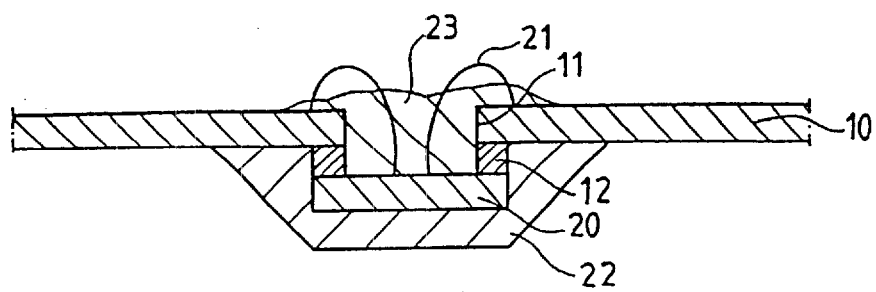
FIG. 1 is a schematic sectional view of a semiconductor chip packaged by a conventional technique.
Figure 2:
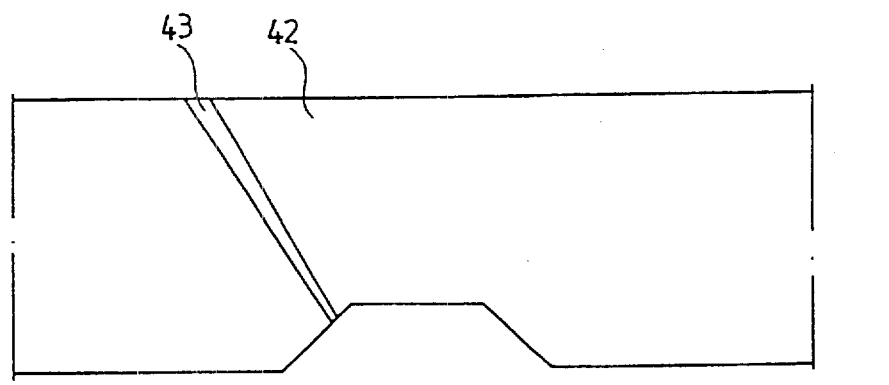
FIG. 2 is an exploded view, partially sectioned, of a semiconductor chip to be packaged using an upper mold and a lower mold in accordance with the present invention.
Figure 2:
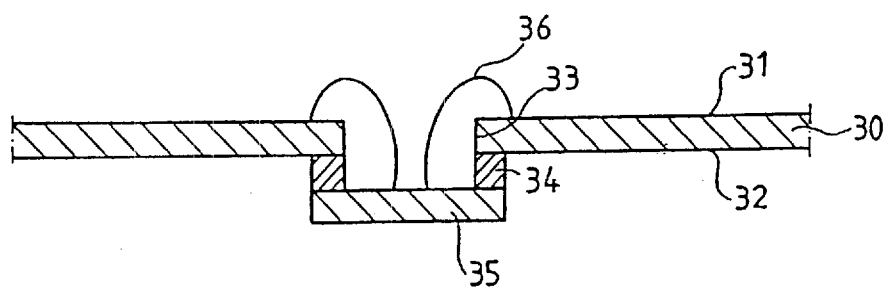
Figure 2:
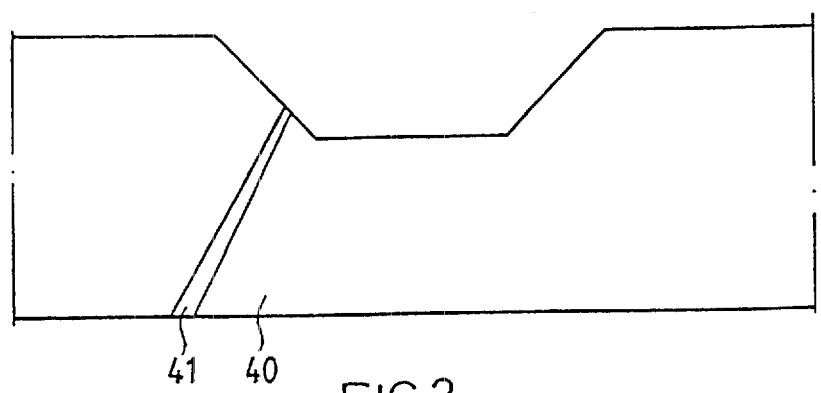
Figure 4:
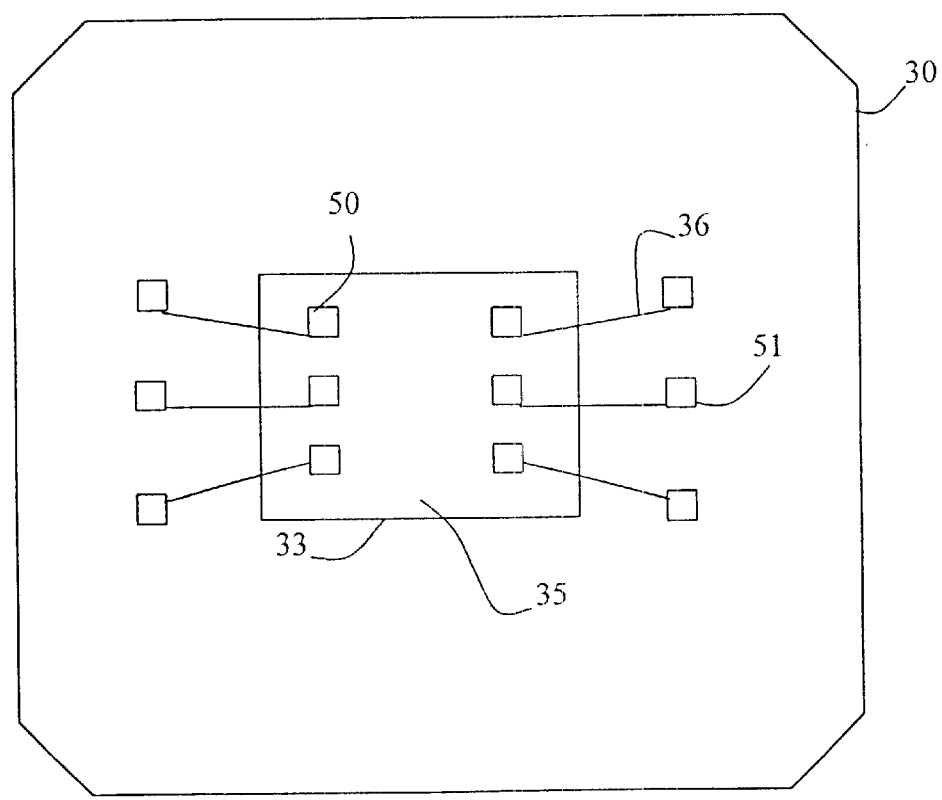
FIG. 4 is a top plan view of the semiconductor chip of FIG. 2 prior to packaging.

Referring to FIGS. 2 and 4, a semiconductor package in accordance with the present invention includes a substrate panel 30 having an upper side 31, an underside 32, and a hole 33 extending through the substrate panel 30 from the upper side 31 to the underside 32. As can be seen in FIG. 4, the substrate panel 30, like the substrate panel 10 of FIG. 1, is a flat board which extends continuously substantially throughout its entire area without interruption except for the hole 33 in a central region thereof. Typically, the substrate panel 30 is a PCB with a plurality of leads or bonding pads 51 (FIG. 4) formed thereon or therein. In a BGA application, the substrate panel 30 is a laminated substrate.

A die pad 34 is mounted (e.g., by adhering) to the underside 32 of the substrate panel 30 around the hole 33. A chip 35 is mounted to an underside 32 of the die pad 34, and a plurality of wires 36 interconnect leads 50 (FIG. 4) on the chip 35 with the leads 51 on the upper side 31 of the substrate panel 30, thereby connecting the integrated circuits (not shown) of the chip 35 with the layout (not shown) of the substrate panel 30.

An upper mold 42 is placed on the upper side 31 of the substrate panel 30 above the hole 33, and a lower mold 40 is placed on the underside 32 of the substrate panel 30 and below the hole 33. Each of the upper mold 42 and the lower mold 40 includes a mold gate 43, 41 through which molten liquid plastic material is poured into the molds 42 and 40.

Figure 3:
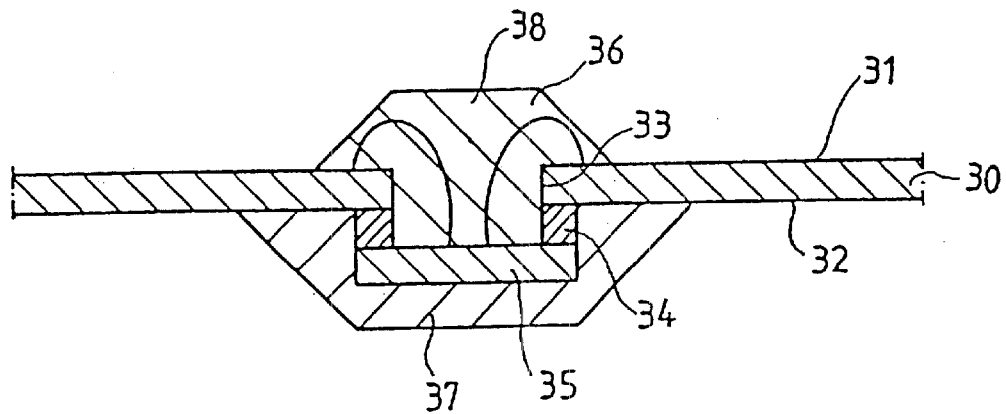
FIG. 3 is a sectional view of a semiconductor package in accordance with the present invention.

Molten liquid plastic material is poured into the molds 42 and 40 via the mold gates 43 and 41 so as to form an upper package encapsulant 38 and a lower package encapsulant 37 on the upper side 31 and the lower side 32 of the substrate panel 30, respectively, thereby providing a completely air tight environment for the chip 35, as shown in FIG. 3. It is not necessary to package the substrate panel 30 in a vacuum environment, as the filling of the molten liquid plastic material undergoes by using the upper and lower molds 42 and 40.

Comparing FIG. 1 with FIG. 3, the upper package encapsulant 38 formed on the upper side 31 of the substrate panel 30 in accordance with the present invention has a regular shape and a flat surface, defined by the configuration of the upper mold 42, unlike the upper package encapsulant 23 formed by the conventional dropping technique. In addition, the wires 36 are not exposed and they are completely covered by the upper package encapsulant 38. Air bubbles will not be generated in the upper package encapsulant 38. Thus, the problems of irregular shape of the package encapsulant, rugged surface of the package encapsulant, exposure of wires, and generation of air bubbles in the package encapsulant formed by the conventional technique are all avoided. Furthermore, the shape of the upper package encapsulant 38 can be changed in response to a change in the configuration of the upper mold 42. Letters or the like can be formed on the upper package encapsulant 38 to change the appearance. The amount of material needed for forming the upper package encapsulant 38 can be effectively controlled to avoid waste.

It will be readily seen by one of ordinary skill in the art that the present invention fulfills all of the objects set forth above. After reading the foregoing specification, one of ordinary skill will be able to affect various changes, substitutions of equivalents and various other aspects of the invention as broadly disclosed herein. For example, the semiconductor package of the invention can be used for surface-mount, other than BGA, applications as long as a substrate panel as shown in FIG. 4 is used to accommodate the chip. It is, therefore, intended that the protection granted hereon be limited only by the definition contained in the appended claims and equivalents thereof.

What is claimed is:

1. A semiconductor package, comprising:
   a substrate panel extending continuously substantially throughout its entire area without interruption except for a single hole in a central region of the substrate panel, the substrate panel having an upper side and a underside communicated by the hole, the substrate panel further having a plurality of first leads formed thereon;
   a chip mounted to the underside of the substrate panel, the chip having a plurality of second leads formed thereon;
   a plurality of wires interconnecting the first leads of the substrate panel with the second leads of the chip;
   an upper package encapsulant formed on the upper side of the substrate panel, the upper package encapsulant being formed by means of filling molten liquid plastic material into an upper mold through an upper mold gate thereof, said upper mold being placed on the upper side of the substrate panel; and
   a lower package encapsulant formed on the underside of the substrate panel, the lower package encapsulant being formed by means of filling molten liquid plastic material into a lower mold through a lower mold gate thereof, said lower mold being placed on the underside of the substrate panel;
   wherein the upper package encapsulant and the lower package encapsulant are formed simultaneously for sealing the chip completely.

2. The semiconductor package as claimed in claim 1, further comprising a die pad adhered to the underside of the substrate panel around the hole of the substrate panel for mounting the chip.

3. The semiconductor package as claimed in claim 1, wherein the plurality of wires is encapsulated completely within the upper package encapsulant.

4. The semiconductor package as claimed in claim 1, wherein the plurality of first leads are formed on the upper side of the substrate panel, and the plurality of second leads are formed on an upper surface of the chip.

5. The semiconductor package as claimed in claim 1, wherein the substrate panel comprises a printed circuit board.

6. A semiconductor package, comprising:
   a substrate panel extending continuously substantially throughout its entire area without interruption except for a single hole in a central region of the substrate panel, the substrate panel having an upper side and a underside communicated by the hole, the substrate panel further having a plurality of first leads formed thereon;
   a chip mounted to the underside of the substrate panel, the chip having a plurality of second leads formed thereon;
   a plurality of wires interconnecting the first leads of the substrate panel with the second leads of the chip;
   an upper package encapsulant formed on the upper side of the substrate panel, the upper package encapsulant being formed by means of filling molten liquid plastic material into an upper mold through an upper mold gate thereof, said upper mold being placed on the upper side of the substrate panel; and
   a lower package encapsulant formed on the underside of the substrate panel, the lower package encapsulant being formed by means of filling molten liquid plastic material into a lower mold through a lower mold gate thereof, said lower mold being placed on the underside of the substrate panel;

wherein the upper package encapsulant and the lower package encapsulant are formed simultaneously for sealing the chip completely; and wherein the single hole is substantially sealed with the chip which together with the substrate panel completely separates the upper package encapsulant from the lower package encapsulant.

7. The semiconductor package as claimed in claim 6, further comprising a die pad adhered to the underside of the substrate panel around the hole of the substrate panel for mounting the chip.

8. The semiconductor package as claimed in claim 6, wherein the plurality of wires is encapsulated completely within the upper package encapsulant.

9. The semiconductor package as claimed in claim 6, wherein the plurality of first leads are formed on the upper side of the substrate panel, and the plurality of second leads are formed on an upper surface of the chip.

10. The semiconductor package as claimed in claim 6, wherein the substrate panel comprises a printed circuit board.

* * * * *